United States Patent [19]

Tanaka et al.

[11] Patent Number: 5,542,064
[45] Date of Patent: Jul. 30, 1996

[54] DATA READ/WRITE METHOD BY SUITABLY SELECTING STORAGE UNITS IN WHICH MULTIPLE COPIES OF IDENTICAL DATA ARE STORED AND APPARATUS THEREFOR

[75] Inventors: Atsushi Tanaka; Hitoshi Kakuta, both of Kokubunji; Yoshifumi Takamoto, Hachioji, all of Japan

[73] Assignee: Hitachi, Ltd., Tokyo, Japan

[21] Appl. No.: 979,275

[22] Filed: Nov. 20, 1992

[30] Foreign Application Priority Data

Nov. 21, 1991 [JP] Japan .................................. 3-305928

[51] Int. Cl.⁶ .................................................. G06F 13/00
[52] U.S. Cl. .................... 395/441; 395/421.11; 395/489; 395/495
[58] Field of Search ..................... 364/260 MS, 900 MS; 395/400 MS, 425 MS

[56] References Cited

U.S. PATENT DOCUMENTS

| 4,995,040 | 2/1991 | Best et al. | 371/36 |
| 5,170,466 | 12/1992 | Rogan et al. | 395/400 |
| 5,321,816 | 6/1994 | Rogan et al. | 395/425 |

FOREIGN PATENT DOCUMENTS

| 1-171015 | 7/1989 | Japan . |
| 2-236714 | 9/1990 | Japan . |

OTHER PUBLICATIONS

"Disk Shadowing", Proceedings of the 14th International Conference on Very Large Data Bases, 1988, Bitton et al, pp. 331–338.
"A Case of Inexpensive Disks (RAID)", ACMSIGMOD Conference, 1988, Patterson et al. pp. 1–25.

Primary Examiner—Reba I. Elmore
Attorney, Agent, or Firm—Fay, Sharpe, Beall, Fagan, Minnich & McKee

[57] ABSTRACT

When a CPU serving as a higher rank apparatus issues an input command to a secondary storage device having a plurality of disk drives, a predetermined number of disk drives each being less in the number of input/output commands to be processed and having a free capacity are selected from the plurality of disk drives so that identical data are multiply written in the selected disk drives. A data address management table for managing data stored in the respective disk drives, a free area management table for managing free areas in the respective disk drives and a disk drive management table for managing the number of input/output commands to be processed in each of the disk drives are generated in a controller in the secondary storage device. Processors in the controller select a predetermined number of optimum disk drives by referring to these tables in response to the input command given from the CPU.

21 Claims, 13 Drawing Sheets

FIG. 5

| DISK DRIVE NUMBER (401) | NUMBER OF I/O COMMANDS TO BE PROCESSED (402) |
|---|---|
| # 1 | 110 |
| # 2 | 000 |
| # 3 | 011 |
| # 4 | 000 |
| # 5 | 111 |
| ⋮ | ⋮ |
| # n | 000 |
| # n+1 | 000 |

(60)

DATA READ/WRITE METHOD BY SUITABLY SELECTING STORAGE UNITS IN WHICH MULTIPLE COPIES OF IDENTICAL DATA ARE STORED AND APPARATUS THEREFOR

CROSS-REFERENCE TO RELATED APPLICATION

The present invention is related to U.S. application Ser. No. 406,581, filed Sep. 13, 1989, assigned to the same assignee, which is incorporated herein by reference.

BACKGROUND OF THE INVENTION

The present invention relates to a method for controlling reading/writing of data in a secondary storage device used in a data processing system and also relates to an apparatus therefor. Particularly, it relates to a method for controlling multiple writing of identical data in a predetermined number of storage units among storage units such as disk drives included in a secondary storage device and also relates to an apparatus therefor.

Heretofore, improvement of performance of a secondary storage device has been mainly directed to increase of the storage capacity and enhancement of the data transfer rate. With the enhancement of processing time in computers, it has been directed to enhancement of input/output throughput in a secondary storage device. As one technique for enhancing the input/output throughput, a method in which identical data are written in all of a number n (in which n is an integer of two or more) of disk drives so that a data output command is given to all the disk drives at the time of reading of data to thereby make it possible to read the data from a disk drive allowed to process the data output command earliest has been proposed.

The proposed method has been disclosed in a paper written by Dina Bitton et al, University of Illinois: "DISK SHADOWING" (Dina Bitton et al, "Disk Shadowing", Processings of the 14th International Conference on Very Large Data Base, 1988, pp. 331–338) and JP-A-1-17015.

As another technique for enhancing the input/output throughput, a technique in which a plurality of disk drives are driven independently so that fractions obtained by dividing one data are respectively written in the plurality of disk drives is known. For example, as this technique, a method of RAID (Redundant Arrays of Inexpensive Disks) has been proposed by University of California, Berkeley.

The proposed method has been disclosed in a paper written by D. Patterson et al, University of California, Berkeley: "A Case for Redundant Arrays of Inexpensive Disks (RAID)" (David A. Patterson et al, "A Case of Redundant Arrays of Inexpensive Disks (RAID)", ACNSIG-MOD Conference, 1988).

Also in the proposed method, a technique for enhancing reliability by using parity, ECC and so on is shown to solve a problem of lowering of reliability caused by storage of data fractions in a plurality of disk drives. That is, a technique in which correction data to correct respective data are generated by using parity, ECC or the like so that in case of occurrence of a failure in a disk drive, data in the failure disk drive can be recovered on the basis of the correction data and data remaining in normal disk drives, is shown. For example, this technique has been proposed in JP-A-2-236714.

In the former technique represented by the paper "DISK SHADOWING", there is no consideration of the input/output command waiting state of each disk drive at the time of reading/writing of identical data in a plurality of disk drives. Accordingly, if at least one of the plurality of disk drives already has a large number of input/output commands at the time of writing of identical data in the plurality of disk drives, writing of identical data will be delayed as a whole.

Furthermore, in the case of reading identical data from a plurality of disk drive, a read command is given to all the disk drives in which the identical data are stored. Accordingly, an unnecessary input/output command is additionally given to disk drives each already having a large number of input/output commands so that there is not much possibility of reading data earliest.

On the other hand, also in the latter technique represented by the paper "RAID", there is no consideration of the input/output command waiting state of each disk drive at the time of reading/writing of data in a plurality of disk drives. Furthermore, in the case of occurrence of a failure in a disk drive, specific correction data are necessary for recovering data stored in the failure disk drive.

SUMMARY OF THE INVENTION

A primary object of the present invention is to provide a method for controlling multiple writing of identical data to enhance the input/output throughput of a secondary storage device having a plurality of storage units and also to provide an apparatus therefor.

Another object of the present invention is to provide a method for controlling multiple writing of identical data in a secondary storage device to make it possible to generate history data automatically and also to provide an apparatus therefor.

A further object of the present invention is to provide a method for controlling multiple reading/writing of identical data in a secondary storage device having a plurality of storage units without any influence on other input/output commands and also to provide an apparatus therefor.

A further object of the present invention is to provide a method for controlling multiple reading/writing of identical data in a secondary storage device having a plurality of storage units to make it easy to recover data in the case of occurrence of a failure in a storage unit and also to provide an apparatus therefor.

A further object of the present invention is to provide a method for controlling multiple reading/writing of identical data in a secondary storage device having a plurality of storage units to make it possible to extend idle storage units flexibly and also to provide an apparatus therefor.

According to a preferred embodiment of the present invention, the foregoing objects thereof are attained by selecting storage units less in the degree of waiting for processing of input/output commands as a group of storage units to be subjected to multiple writing of identical data in a secondary storage device having a plurality of storage units.

According to a preferred embodiment of the present invention, the foregoing objects thereof are attained by selecting storage units to be subjected to multiple writing of identical data while considering both the data space capacity of each storage unit and the degree of waiting for processing of input/output commands in a secondary storage device having a plurality of storage units.

BRIEF DESCRIPTION OF THE DRAWINGS

FIG. 5 is a diagram showing the configuration of an example of the disk drive management table in the present invention;

DESCRIPTION OF THE PREFERRED EMBODIMENT

An embodiment of the present invention will be described below in detail with reference to the drawings.

Figure 1:
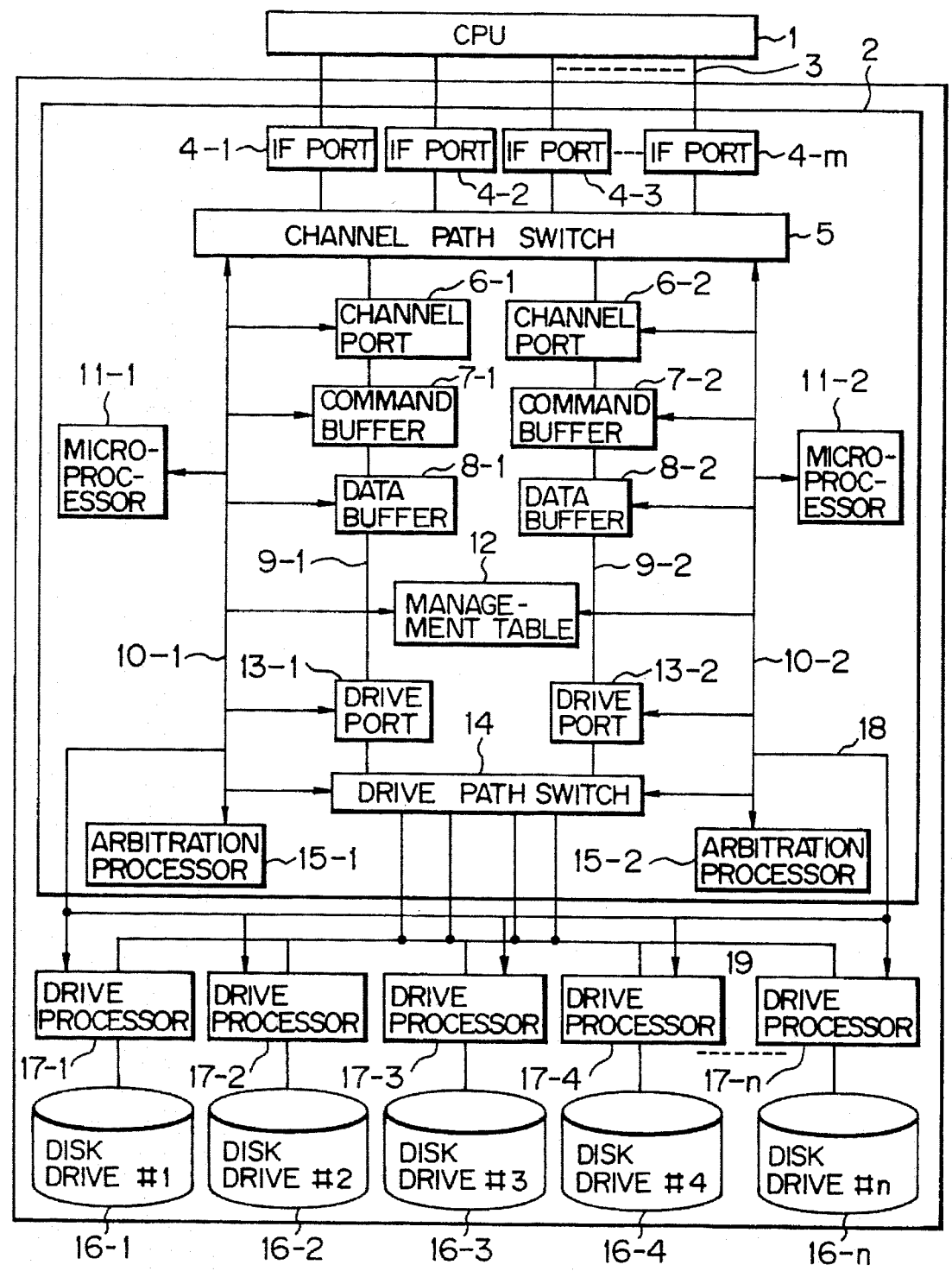
FIG. 1 is a diagram showing the configuration of a secondary storage device as an embodiment of the present invention.

Referring to FIG. 1, there is shown the configuration of an embodiment of a secondary storage device according to the present invention. In this embodiment, by way of example, a secondary storage device having magnetic disk drives as a plurality of storage units is shown. In FIG. 1, the secondary storage device comprises a controller 2 for wholly controlling a plurality of storage units, magnetic disk drives 16-1 to 16-n, and drive processors 17-1 to 17-n for controlling the respective magnetic disk drives 16-1 to 16-n.

In FIG. 1, the reference numeral 1 designates a central processing unit (CPU) which serves as a higher rank processor. The CPU 1 issues commands to the secondary storage device 101 in response to user's requests and receives results of processing from the secondary storage device 101. The controller 2 performs management of I/O commands from the CPU 1, management of stored files (data), and so on. Commands issued from the CPU 1 are fetched by interface ports (hereinafter called IF ports) 4-1 to 4-m through external interface paths 3. Although FIG. 1 shows the case where this system is constituted by two groups, only the operation of one group will be described hereinafter for the purpose of simplification of description. A micro-processor (MP) 11-1 checks whether there is any path allowed to be used among the external interface paths 3. When some path 3 is allowed to be used, the MP 11-1 turns a channel path switch (CPS) 5 to perform command acceptance processing. When the command is not acceptable, the MP 11-1 feeds an answer to the CPU 1 to teach the CPU 1 that the command is unacceptable.

When some command is accepted, the command is transferred to a channel port (CHL port) 6-1 in which a channel protocol is converted into a protocol in the controller 2. After the conversion, the command and data are respectively led to a command buffer (CBUF) 7-1 and a data buffer (DBUF) 8-1 through an internal command path 10-1 and an internal data path 9-1 so that the command and data are respectively temporarily placed in the CBUF 7-1 and the DBUF 8-1 while waiting for the next processing.

The data suitably processed by the MP 11-1 is converted at a drive port 13-1 so as to be matched to the protocol of drive data paths 19. On the other hand, the command is transferred to drive processors 17-1 to 17-n through drive command paths 18. The MP 11-1 checks whether there is any path allowed to be used among the drive data paths 19. When some drive data path 19 is allowed to be used, the MP 11-1 turns a drive path switch (DPS) 14 to transfer the command and data to the drive processors 17-1 to 17-n. When the command and data are not acceptable, the fact that the command and data are unacceptable is registered in a disk drive management table 60.

An arbitration processor 15-1 controls the internal command path 10-1. The drive processors 17-1 to 17-n respectively control disk drives 16-1 to 16-n to thereby control movement of heads, rotational delay thereof, report of detecting the occurrence of a failure, data transfer between each of the disk drives 16-1 to 16-n and the controller 2, and so on. The number of the drive processors 17-1 to 17-n and the number of the disk drives 16-1 to 16-n are generally determined arbitrarily.

In this embodiment, one data from the CPU 1 is stored in a plurality of disk drives by multiple writing.

Figure 2:
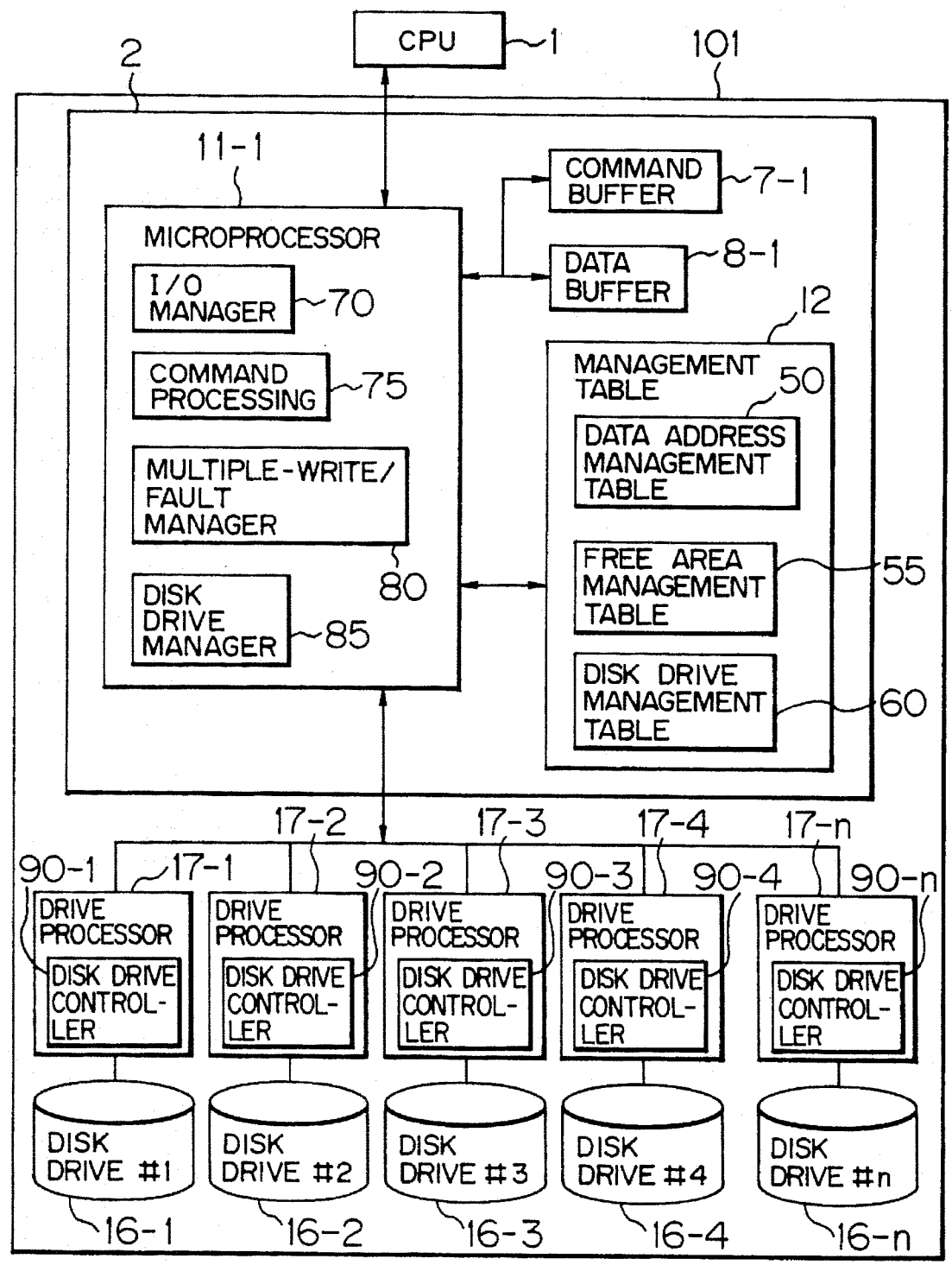
FIG. 2 is a block diagram showing the configuration of the controller 2 depicted in FIG. 1.

Referring to FIG. 2, processes carried out by an MP 11-1 or 11-2 and contents of management tables (MT) 12 are shown. Although it is apparent from FIG. 1 that two groups respectively controlled by MPs 11-1 and 11-2 are provided in this embodiment, only one group will be described below for convenience sake. The MP 11-1 includes an input/output (I/O) manager 70 for performing queuing of commands and data, a command processing manager 75 for performing command address conversion, free area management and so on, a multiple-write/fault manager 80 for performing multiple writing/reading of data and failure recovery, and a disk drive manager 85 for performing management of the frequency in use of each disk drive and the state thereof. Further, a data address management table 50, a free area management table 55 and a disk drive management table 60 which serve as places for storing information necessary for these processes are provided as the management tables (MT) 12. The disk drive processors 17-1 to 17-n respectively have disk drive controllers 90-1 to 90-n for controlling the disk drives 16-1 to 16-n to perform command processing, seeking, searching, data reading/writing, and so on.

Figure 3:
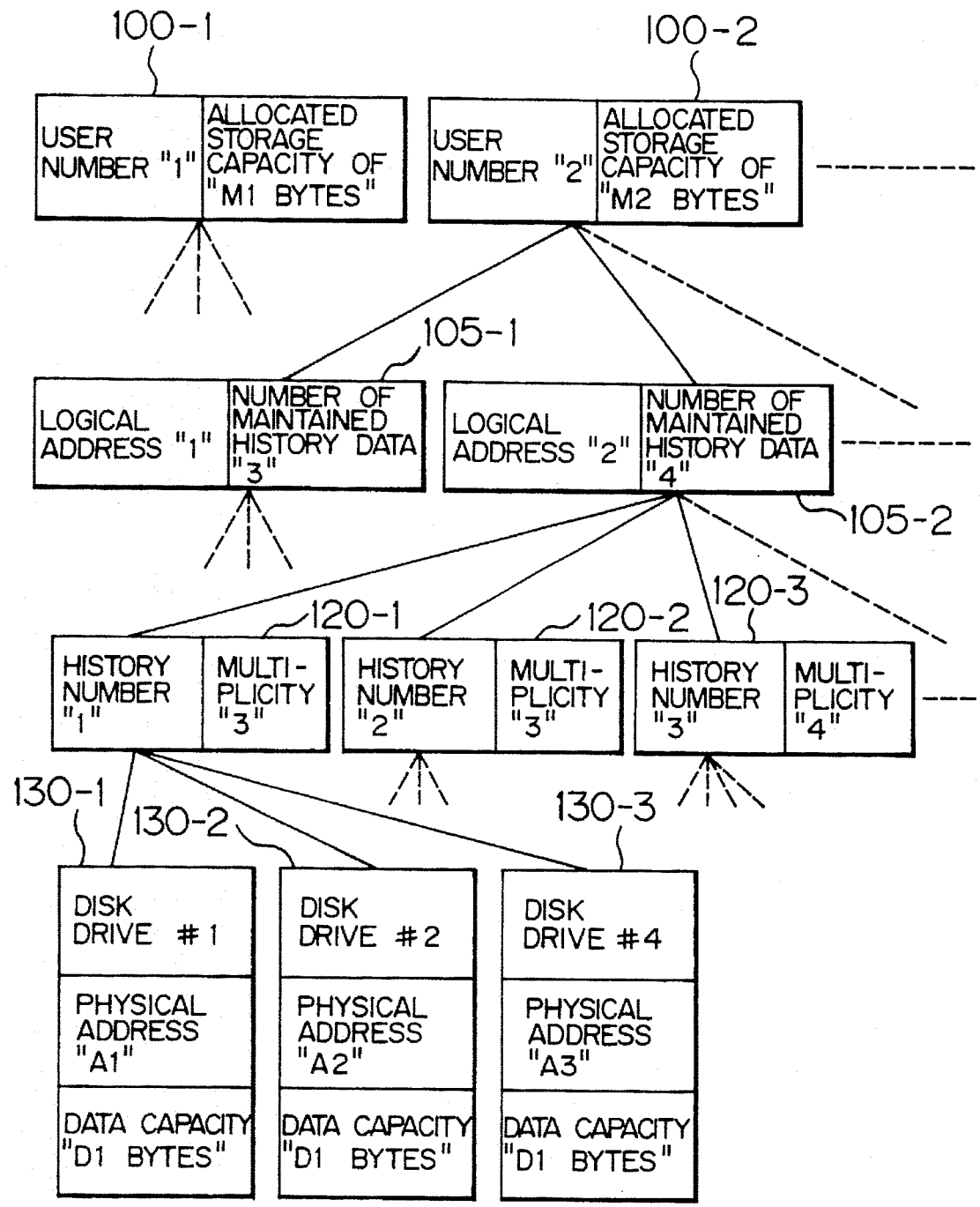
FIG. 3 is a diagram showing the configuration of an example of the data address management table in the present invention.

Referring to FIG. 3, the configuration of the data address management table 50 is shown.

As shown in FIG. 3, the data address management table 50 contains areas as follows. The reference numerals 100-1 and 100-2 designate areas in which user numbers for identifying users and storage capacities allocated to the users are registered so as to be defined correspondingly to the respective users. In FIG. 3, a storage capacity of M1 bytes and a storage capacity of M2 bytes are allocated to a user number "1" and a user number "2", respectively. The reference numerals 105-1 and 105-2 designate areas in which logical addresses as data store positions determined by the CPU 1 and the respective numbers of maintained history data (the number of data before updating, included in data) are registered. In FIG. 3, logical address "1" and logical address "2" have the number "3" of maintained history data and the number "4" of maintained history data, respectively.

The reference numerals 120-1, 120-2 and 120-3 designate areas in which history numbers for indicating the order of updating of data and data multiplicities (the respective numbers of disk drives in which identical data are stored) are registered. In this embodiment, the number given to a data is lower as the data is newer. In FIG. 3, multiplicity "3", multiplicity "3" and multiplicity "4" are registered in a history number "1", a history number "2" and a history number "3", respectively.

The reference numerals 130-1, 130-2 and 130-3 designate areas in which disk drive numbers for identifying disk drives having the data stored therein and physical addresses and data capacities of the areas having the data actually stored in the disk drives are registered. In FIG. 3, the identical data written triply are stored in a physical address A1 of a disk drive #1, a physical address A2 of a disk drive #2 and a physical address A3 of a disk drive #4, respectively. Because the data stored in these physical addresses are identical, each of the areas 130-1, 130-2 and 130-3 has the same data capacity of D1 bytes.

The data address management table 50 as a whole has such a tree structure in which: a plurality of areas 105 are connected to one area 100; a plurality of areas 120 are connected to each of the areas 105; and a plurality of areas 130 are connected to each of the areas 120. Although this embodiment has shown the case where the data address management table 50 as a whole has a tree structure, the present invention can be applied to the case where it may have another structure such as a list structure or a table structure.

As described previously, not only one data is multiplexed but past history data are maintained on the data address management table 50. Accordingly, the capacity of data allocated to each user can be calculated as the sum of values respectively obtained by multiplying respective data capacities by their multiplicities and the numbers of maintained history data. When, for example, the number of data managed in user number j, the data capacity of each data, the multiplicity thereof and the number of maintained history data corresponding to each data are respectively represented by N, Ci, Mi and Hi, the data capacity UCj used in user number j is represented by the following expression (1).

$$UCj = \sum_{j=1}^{N} Ci \times Mi \times Hi \quad (1)$$

When the number of users is L, the data capacity UC used by the all users is represented by the following expression (2).

$$UC = \sum_{j=1}^{L} UCj \quad (2)$$

Accordingly, at least the data capacity UC is necessary for the plurality of storage units as a whole.

In a preferred embodiment in which improvements in performance and reliability are promised both at data reading and at data writing, it is necessary that multiplexed identical data are entirely written in separate disk drives. Therefore, it is desirable that the number of disk drives is larger than the number (multiplicity) of identical data. If only an improvement in performance at data reading is required, it can be provided by writing identical data in different storage areas of one disk drive. In this case, the number of disk drives may be smaller than the number (multiplicity) of identical data.

The structure of the free area management table 55 will be described below with reference to FIG. 4.

Figure 4:
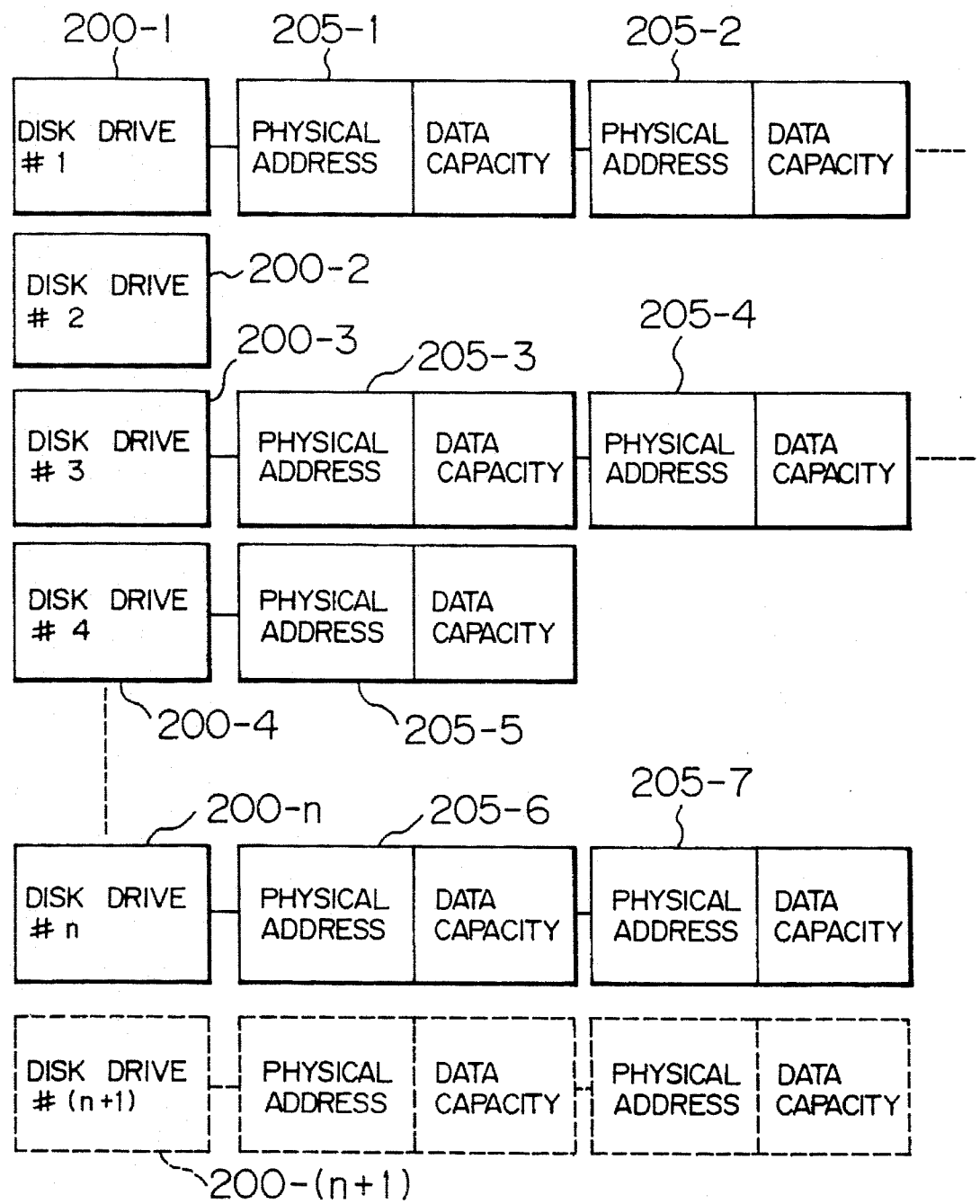
FIG. 4 is a diagram showing the configuration of an example of the free area management table in the present invention.

In FIG. 4, the reference numerals 200-1 to 200-n designate disk drive numbers which are respectively defined for the disk drives 16-1 to 16-n. The reference numerals 205-1 to 205-7 designate areas in which physical addresses for indicating free areas of the disk drives 16-1 to 16-n and capacities of data allowed to be stored in the free areas are registered. FIG. 3 shows the case where the disk drive number #1 has free areas 205-1 and 205-2, the disk drive number #3 has free areas 205-3 and 205-4, the disk drive number #4 has a free area 205-5, and the disk drive number #n has free areas 205-6 and 205-7, but the disk drive number #2 has no free area. The free area management table 55 as a whole has a list structure. Although this embodiment has shown the case where the free area management table 55 as a whole has a list structure, the present invention can be applied to the case where it may have another structure such as a tree structure or a table structure. The free area capacity of the storage units can be calculated as the sum of values respectively obtained by adding up the data capacities of the areas 205 for each of the disk drives 16-1 to 16-n. When, for example, the free area capacity of each disk drive and the number of disk drives are respectively represented by ECk and D, the free area capacity EC necessary for the storage units as a whole is represented by the following expression (3).

$$EC = \sum_{k=1}^{D} ECk \quad (3)$$

When the data capacity of the free areas is EC, the storage capacity AC necessary for the storage units as a whole is calculated as the sum of the data capacity EC and the data capacity UC and represented by the following expression (4).

$$AC = EC + UC \quad (4)$$

In the storage units in this embodiment, the performance of I/O processing is improved by writing input data in a free area of a disk drive allowed to be used earliest. Therefore, it is necessary to keep the free area capacity ECk of each disk drive sufficient to bring out the best of the performance. When the free area capacity of each disk drive is short or absent, the data is written in disk drives having already received other I/O commands but even in this case, there is no lowering of the I/O processing performance compared with the case of general storage units. When the free area capacity of each disk drive is short, a part of history data or the multiplicity may be reduced so that the area thus created can be used as a free area. In practical use, other areas, such as memory save areas for saving the data address management table 50, the free area management table 55 and the disk drive management table 60, data check areas for checking recovered data, and so on, are required.

Referring to FIG. 5, the structure of the disk drive management table 60 is shown.

In FIG. 5, the disk drive management table 60 contains the disk drive number registration area 401 for identifying the respective disk drives 16-1 to 16-n, and an area 402 for registering the number of I/O commands given to each of the disk drives 16-1 to 16-n. In the area 402 for registering the number of I/O commands to be processed in FIG. 5, the number of I/O requests is represented by three binary digits in each column. When a failure occurs in some disk drive to make it impossible to use the disk drive, a flag for indicating that the disk drive cannot be used may be set in a column of the area 402 corresponding to the failure disk drive. In FIG. 5, the maximum value "111" allowed to be represented by three binary digits is used as a flag for indicating that the disk drive cannot be used. That is, in FIG. 5, the disk drive number #5 cannot be used. FIG. 5 further shows the case where the disk drives 16-2 and 16-n respectively identified by disk drive numbers #2 and #4 are free from I/O commands to be processed and the disk drive 16-1 identified by disk drive number #1 is waiting for processing of six I/O commands. FIG. 5 further shows the case where the disk drive 16-3 identified by disk drive number #3 has three I/O commands to be processed.

The processing procedure in the I/O manager 70, the CBUF 7-1 (or 7-2) and the DBUF 8-1 (or 8-2) will be described below with reference to a flow chart of FIG. 6.

When I/O processing is started, the I/O manager 70 first checks the state of I/O commands and data maintained in the CBUF 7-1 and the DBUF 8-1 (a step 505). In this case, a queue in the CBUF 7-1 and the DBUF 8-1 is counted to check whether the queue is larger than a threshold which has been set preliminarily. When, for example, the queue in the CBUF 7-1 and the DBUF 8-1 is not larger than the threshold, a judgment is made in the next step as to whether there is any I/O command given from the CPU 1 (a step 510). When, for example, a new I/O command is given from the CPU 1, the inputting of the I/O command is accepted (a step 515). Then, the I/O command accepted in the step 515 is stored in the queue in the CBUF 7-1 and the DBUF 8-1 (a step 520). Then, the queue in the CBUF 7-1 and the DBUF 8-1 is sorted in order of priority incident to the I/O command (a step 525). Then, the situation of the routine goes back to the step 505.

When, for example, the judgment in the step 505 shows that the queue is larger than the threshold, a judgment is made as to whether the command processing manager 75 can process the I/O command (a step 530). When, for example, the command processing manager 75 is currently used for processing another I/O command so that it is impossible to process any more I/O command, the situation of the routine goes back to the step 505. When, for example, the judgment shows that the command processing manager 75 can process a new I/O command, I/O commands by a number allowable to be processed are transferred to the command processing manager 75 in the order of sorting (a step 535). Thereafter, the situation of the routine generally goes back to the step 505 to continue the I/O command processing. When, for example, the I/O processing is not to be continued, the I/O command processing routine is terminated (a step 545).

Figure 6:
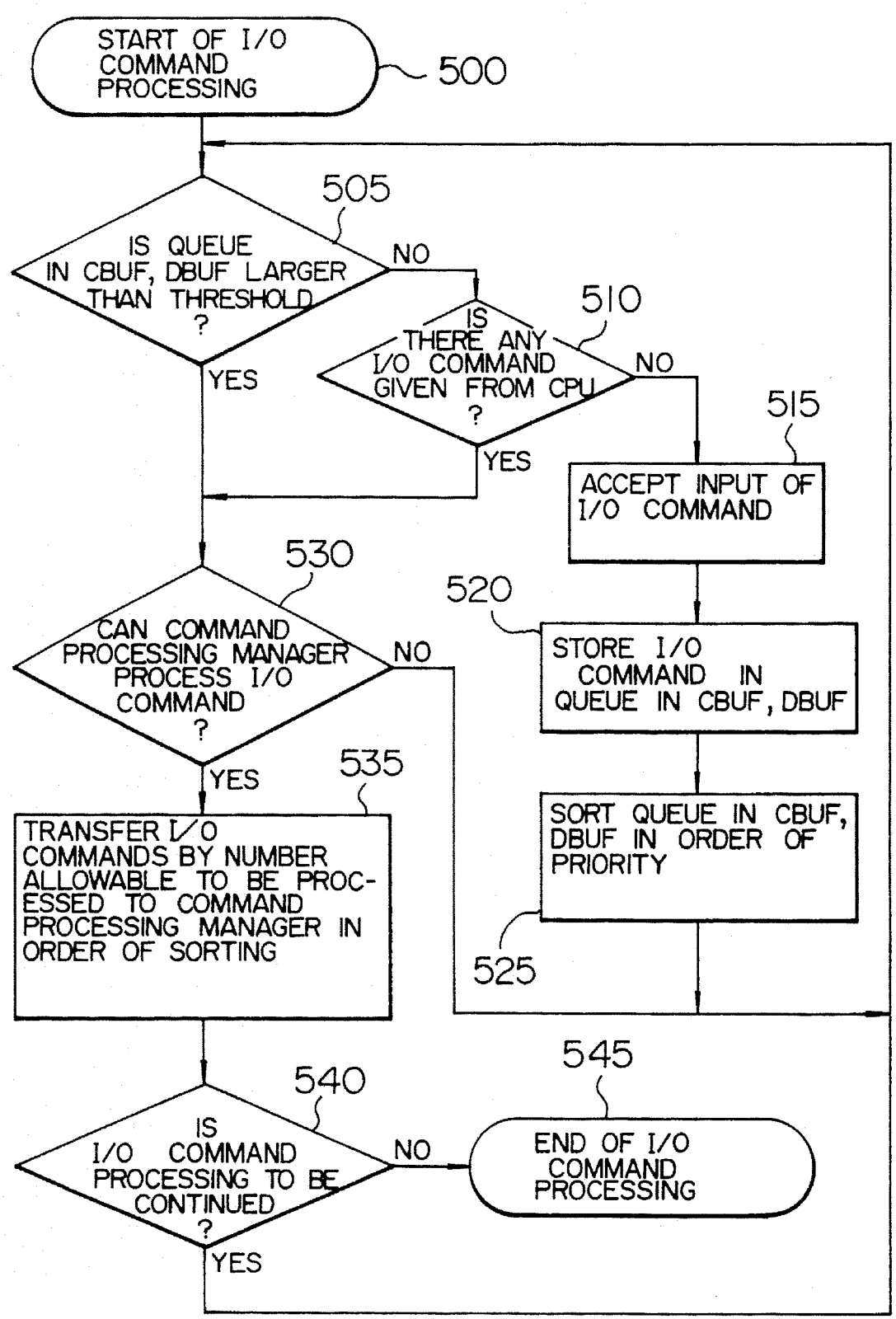
FIG. 6 is a flow chart showing a processing routine in the I/O manager.

As is obvious from FIG. 6, in this embodiment, acceptance of the inputting of I/O commands from the CPU 1 has priority over the routine of transferring I/O commands stored in the CBUF 7-1 (or 7-2) and the DBUF 8-1 (or 8-2) from the I/O manager 70 to the command processing manager 75, in the case where the queue in the CBUF 7-1 (or 7-2) and the DBUF 8-1 (or 8-2) is not larger than the threshold.

Input command processing and output command processing as the routines in the command processing manager 75 will be respectively described below.

Figure 7:
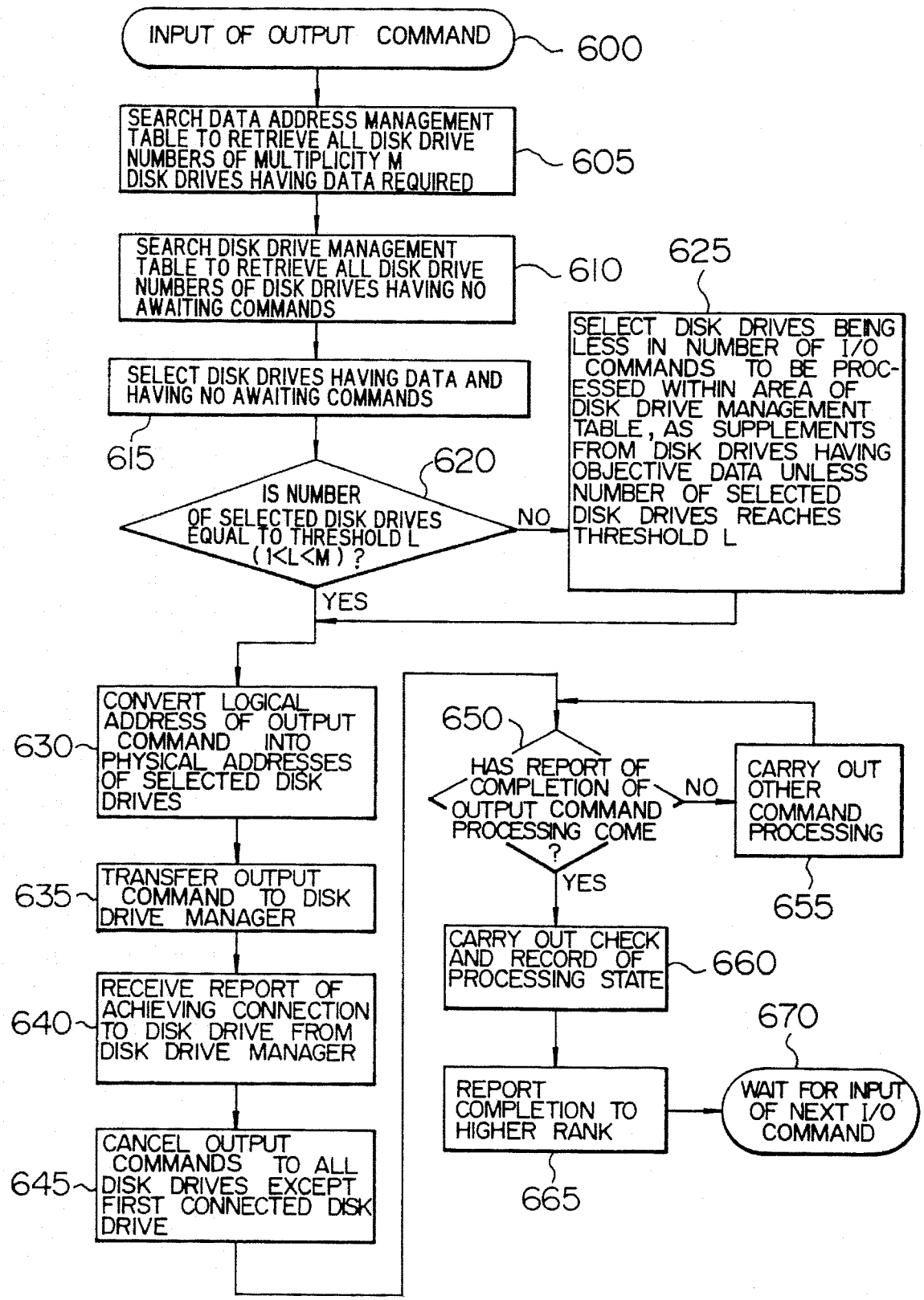
FIG. 7 is a flow chart showing an output command processing routine in the command processing manager.

FIG. 7 is a flow chart showing the output command processing (data read) routine in the command processing manager 75.

When an output command from the CPU 1 is transferred to the command processing manager 75 through the I/O manager 70, the command processing manager 75 starts output command processing (data read from the secondary storage device 101 to the CPU 1) (a step 600). The disk drive numbers of m disk drives having data required by the command are retrieved by searching the data address management table 50 on the basis of the logical address of the output command set by the CPU 1 (a step 605). Here, m is an integer representative of multiplicity. In the step 605, a user number is confirmed and then a logical address managed by the user number is retrieved from the areas 105, so that the disk drive numbers of disk drives in which data of the lowest history number among data corresponding to the logical address are stored are read from the areas 130. (For example, disk drive numbers #1, #2 and #4 are read.) Then, all the disk drive numbers of disk drives 16 not subjected to I/O processing, that is, all the disk drive numbers of idle disk drives which have no commands to be processed, that is, which the area 402 of the disk drive management table 60 has zero, that is, "000" as a binary number are retrieved (a step 610). Although above description has been made upon the case where the processing in the steps 605 and 610 is made in this order, the present invention can be applied to the case where the processing may be made in parallel. Then, idle disk drives having the requested data and selected from the disk drives retrieved in the steps 605 and 610 (a step 615). Then, in a step 620, a judgment is made as to whether the number of the selected disk drives is larger than the threshold l determined preliminarily, whose l is a plural less than m.

When, for example, the number of the disk drives selected in the step 615 is not larger than the threshold, disk drives being less in the number of I/O commands to be processed in the area 402 of the disk drive management table 60 are selected as supplements from disk drives having the objective data unless the number of the selected disk drives reaches the threshold l (a step 625). In order to enable selection of these disk drives, the multiplicity m must be greater than or equal to "3" and the total number n of the disk drives in the system must be greater than or equal to m. After the step 625, the logical address of the output command from the CPU 1 is converted into the physical addresses of the selected disk drives by using the data address management table 50 (a step 630). At this time, a number of output commands to be issued to disk drive processors 17-1 to 17-n are generated correspondingly to the number of the selected disk drives.

Then, the output commands generated in the step 630 are transferred to the disk drive manager 85 (a step 635). When a report of achieving a connection to one of the disk drives 16-1 to 16-n receiving the output commands is received from the disk drive manager 85 (a step 640), output commands to all the disk drives except the first connected disk drive (for example, 16-2) are canceled but processing in the first connected disk drive is continued (a step 645).

Then, unless the reading of data from the disk drives 16 is terminated so that a report of completion of the output command processing comes from the disk drive manager 85 in a step 650, other command processing is carried out (steps 650 and 655). When, for example, a report of completion comes from the disk drive manager 85, the output command processing state is then checked and recorded (a step 660) whereafter completion of the output command processing is reported to the CPU 1 (a step 665). When the aforementioned processing is terminated, the command processing manager 75 waits for the next I/O command given from the I/O manager 70 (a step 670).

Figure 8:
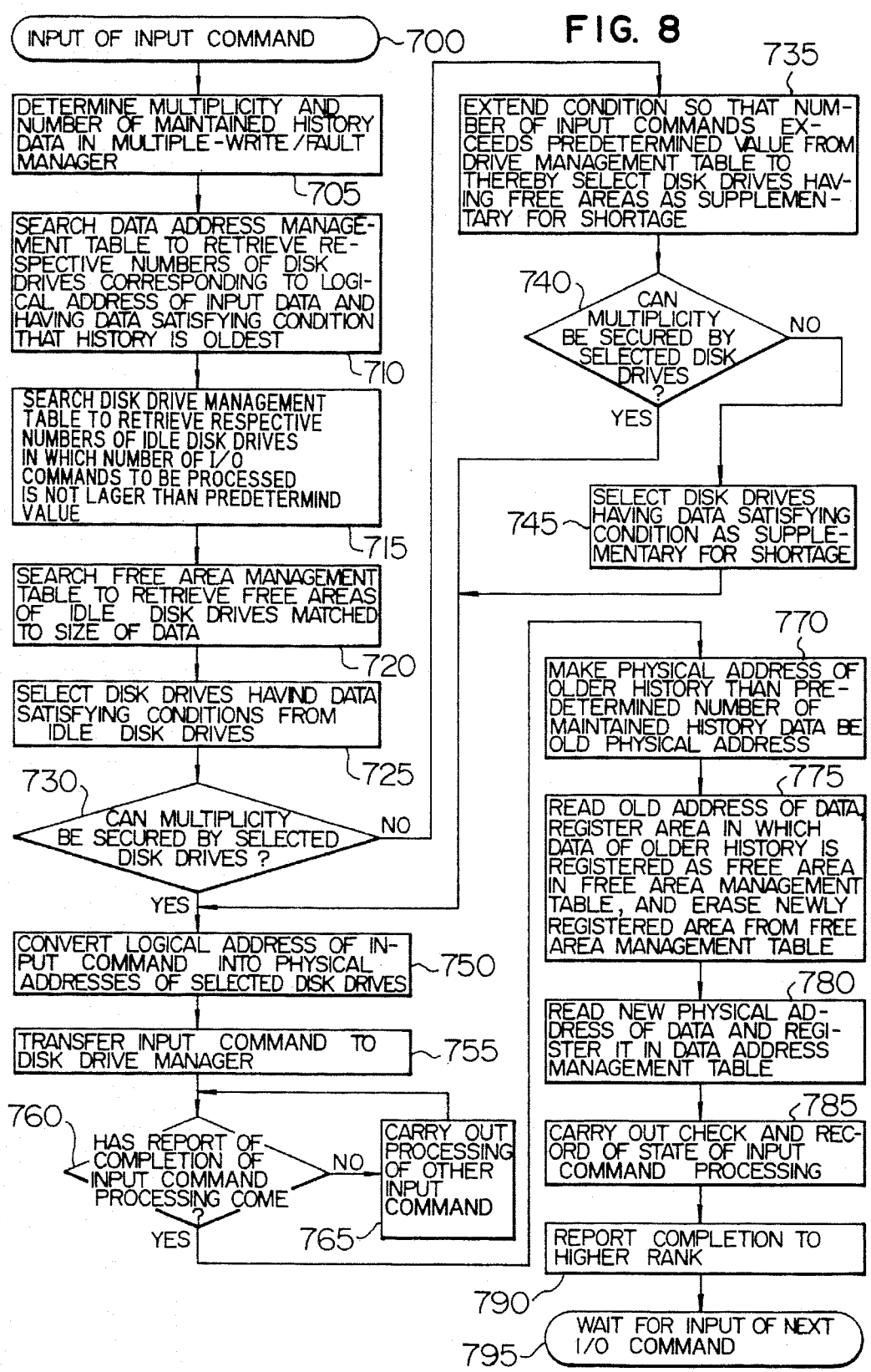
FIG. 8 is a flow chart showing an input command processing routine in the command processing manager.

FIG. 8 is a flow chart showing the input command processing (multiple writing of data from the CPU 1 to the secondary storage device 101) in the command processing manager 75.

When an input command from the CPU 1 is transferred to the command processing manager 75 through the I/O manager 70, the command processing manager 75 starts input command processing (a step 700). First, an input command is transferred to the multiple-write/fault manager 80, so that multiplicity and the number of maintained history data are received from the multiple-write/fault manager 80 (a step 705). Then, disk drives corresponding to the logical address of the input data set by the CPU 1 and having data satisfying the condition that the history is oldest are retrieved from the data address management table 50 (a step 710). Then, idle disk drives in which the number of I/O commands to be processed, recorded in the area 402 of the disk drive management table 60 is not larger than a predetermined number are retrieved (a step 715). Then, free areas of respective disk drives matched to the size of data are secured from the free area management table 55 (a step 720). Although above description has been made upon the case where the processing in the steps 710, 715 and 720 is made in this order, the present invention can be applied to the case where the processing may be made in parallel. Although the step 710 is necessary for multiple writing in the case where the secondary storage device 101 has a small free area capacity, the step 710 may be only used for deleting the oldest history data in the case where the secondary storage device 101 has a sufficient free area capacity.

Then, common disk drives detected by the two steps 715 and 720 are selected from the idle disk drives 16 retrieved in the steps 715 and 720 (a step 25). A judgment is made as to whether the number of the selected disk drives can satisfy the multiplicity received from the multiple-write/fault manager 80 (a step 730).

When, for example, the number of the disk drives selected in the step 725 cannot satisfy the multiplicity, disk drives having free areas, retrieved in the step 720, are selected from disk drives in which the number of I/O commands is larger than the predetermined number (a step 735). Further, a judgment is made as to whether the number of the disk drives selected in the steps 725 and 735 can satisfy the multiplicity received from the multiple-write/fault manager 80 (a step 740). When, for example, the number of the selected disk drives cannot satisfy the multiplicity still, supplements are selected from disk drives having data satisfying the condition, retrieved in the step 710 (a step 745).

After the condition in the step 730 or 740 is satisfied or the disk drives 16 are secured in the step 745, the logical address of the input command is converted into the physical addresses of the selected disk drives by using the data address management table 50 (a step 750). At this time, a number of input commands to be issued to disk drive processors 17 corresponding to the selected disk drives are generated correspondingly to the number of the selected disk drives. The input commands generated in the step 750 are transferred to the disk drive manager 85 in a step 755. Other I/O command processing is made unless a report of completion of the input command processing comes from the disk drive manager 85 (steps 760 and 765).

When a report of completion comes from the disk drive manager, the physical address of older history than the predetermined number of maintained history data received from the multiple-write/fault manager 80 is dealt with as an old physical address by using the result of the step 710 (a step 770). The old address of the data is read from the data address management table 50 so that the area in which the data of older history is registered as a free area in the free area management table 55. In the case where a new data is stored in a free area, the area is erased from the free area management table 55 (a step 775). Then, the new physical address of the data is read and registered in the data address management table 50 (a step 780). Then, the state of input command processing is checked and recorded (a step 785) whereafter the completion of the processing is reported to the CPU 1 (a step 790). When the aforementioned processing is completed, the command processing manager 75 waits for the next I/O command given from the I/O manager 70 in the same manner as described above in the case of an output command.

Figure 9:
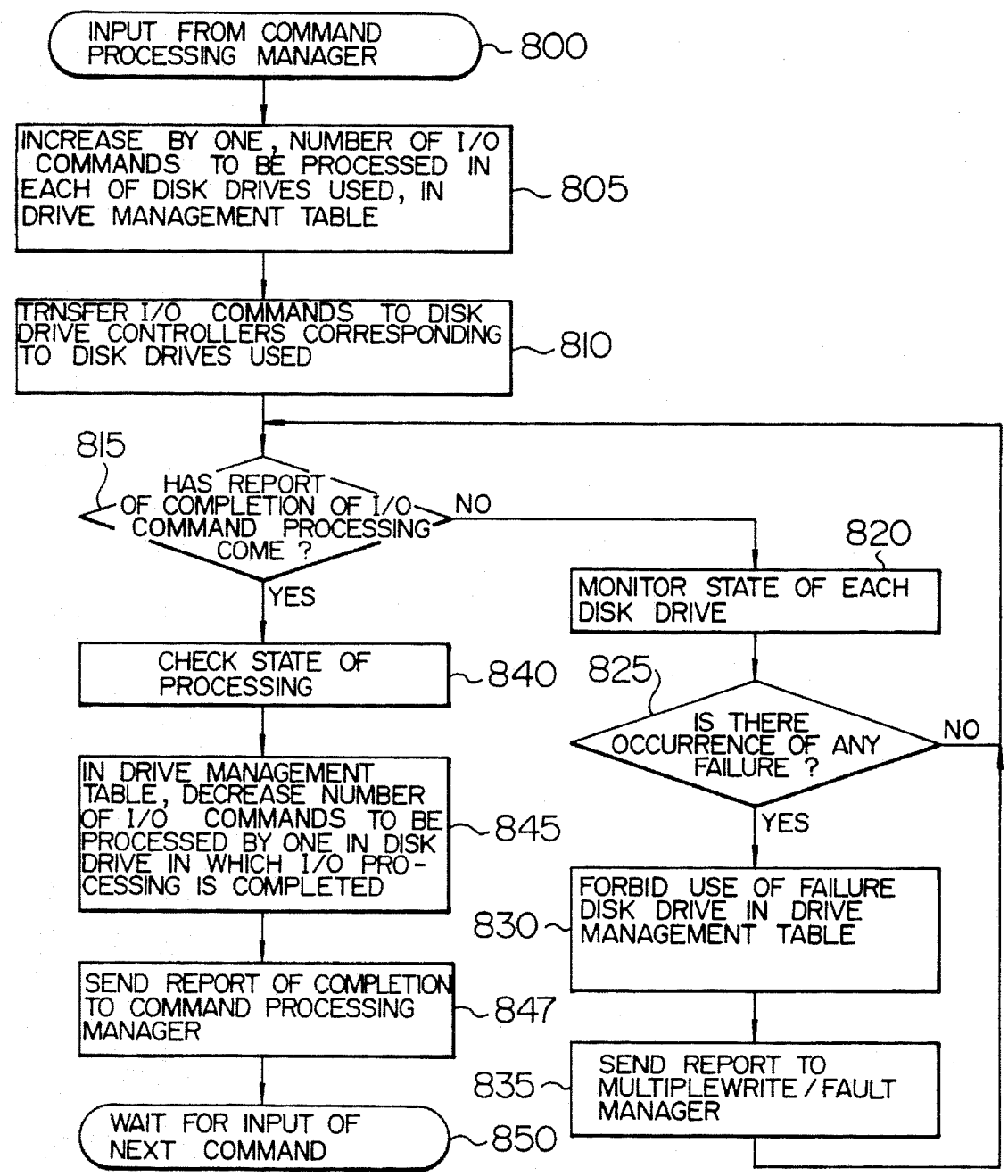
FIG. 9 is a flow chart showing a processing routine in the disk drive manager.

FIG. 9 is a flow chart showing the I/O command processing in the disk drive manager 85.

The disk drive manager 85 starts processing by receiving I/O commands to the respective drive processors 17-1 to 17-n (a step 800). When the I/O commands are received from the command processing manager 75, the disk drive manager 85 searches the disk drive management table 60 and increases by one the number (area 402) of I/O commands to be processed in each of disk drives used on the basis of the I/O commands (a step 805). Then, the I/O commands received from the command processing manager 75 are respectively transferred to disk drive controllers 90 in disk drive processors 17 corresponding to the disk drives 16 used (a step 810). Then, a judgment is made as to whether a report of completion of I/O processing comes from each of the drive processors 17 (a step 815).

When, for example, the report of completion does not yet come, the state of each disk drive is then monitored so that a judgment is made as to whether a failure occurs in any one of the disk drives 16-1 to 16-n and the disk drive processors 17-1 to 17-n (steps 820 and 825). When no failure occurs, the situation of the routine goes back to the step 815. When a failure occurs in any one of the disk drives 16-1 to 16-n and the drive processors 17-1 to 17-n, a flag indicating that the failure disk drive cannot be used is set in a corresponding area (area 402) of the number of I/O commands to be processed, in the disk drive management table 60 to forbid use of the failure disk drive (a step 830). Then, the occurrence of a failure is reported to the multiple-write/fault manager 80 (a step 835). When, for example, the report of completion of I/O processing comes in the step 815, the state of processing is checked whereafter the number of I/O commands to be processed in each disk drive in which I/O processing is completed is decreased by one in the disk drive management table (a step 845). Finally, completion of I/O command processing is reported to the command processing manager 75 to terminate the processing (a step 847). When the aforementioned processing is terminated, the disk drive manager 85 waits for the next I/O command from the command processing manager 75 (a step 850).

Figure 10:
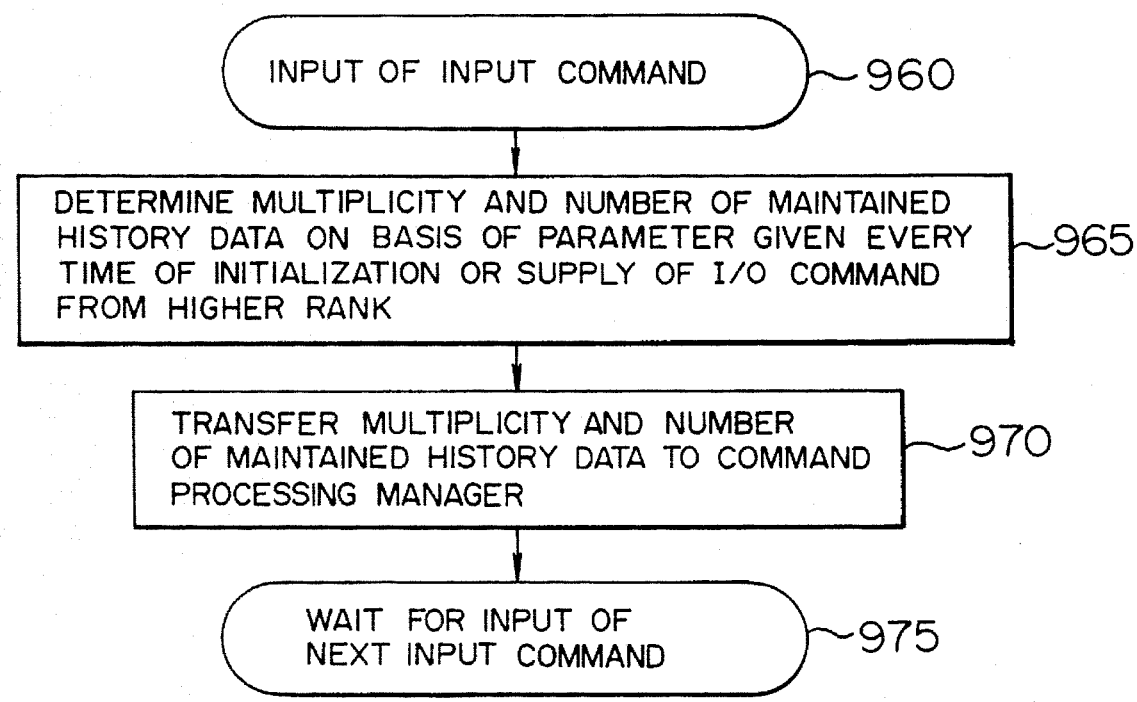
FIG. 10 is a flow chart showing a processing routine in the multiple-write/fault manager in an ordinary state.

FIG. 10 is a flow chart showing the ordinary processing procedure in the multiple-write/fault manager 80 in I/O command processing.

When an I/O command is transferred from the I/O manager 70 to the multiple-write/fault manager 80, the multiple-write/fault manager 80 determines the multiplicity and the number of maintained history data on the basis of parameter given from the CPU 1 for each I/O command or set by initialization (a step 965). Then, the multiplicity and the number of maintained history data are transferred to the command processing manager 75 (a step 970) whereafter the multiple-write/fault manager 80 waits for the next input command (a step 975).

The method for controlling multiple writing of identical data according to the present invention is effective for recovery of data in the case of occurrence of a failure in any one of the disk drives.

Failure processing in the case of occurrence of a failure in any one of the disk drives in a period of I/O processing will be described below with reference to FIG. 11. When occurrence of a failure in any one of the disk drives is detected (a step 825 in FIG. 9) in the disk drive manager 85 and reported (a step 900) to the multiple-write/fault manager 80, the multiple-write/fault manager 80 temporarily stops the I/O command processing and reports the occurrence of a failure to the CPU 1 (a step 905). Next, in the data address management table 50, the drive number or physical address of the failure disk drive is erased to forbid the use of the failure disk drive (a step 910). Then, the disk drive number or physical address of the failure disk drive is deleted from the free area management table 55 to forbid use of the failure disk drive (a step 915). Further, a check is made as to whether the failure can be recovered or not (a step 920).

When the failure can be recovered, a check is made in the next step 925 as to whether the failure is to be recovered or not. When the failure is to be recovered, the failure recovery processing is continued. The detail of the failure recovery processing will be described later with reference to FIGS. 12 and 13 (a step 930). When the failure is not to be recovered, the I/O command processing is restarted without recovery of the failure (a step 935). When the check shows that the failure cannot be recovered, an inquiry about use of history data is then given to the CPU 1 (a step 940). When history data are used, a check is made as to whether data of old history number are to be used or not (a step 945). If the data can be used, the history number of data of old history is updated while the number of maintained history data is reduced correspondingly. Then, the situation of the routine goes to a step 925. If the data of old history number cannot be used, loss of data is reported to the CPU 1 whereafter this system is stopped (a step 955).

Figure 11:
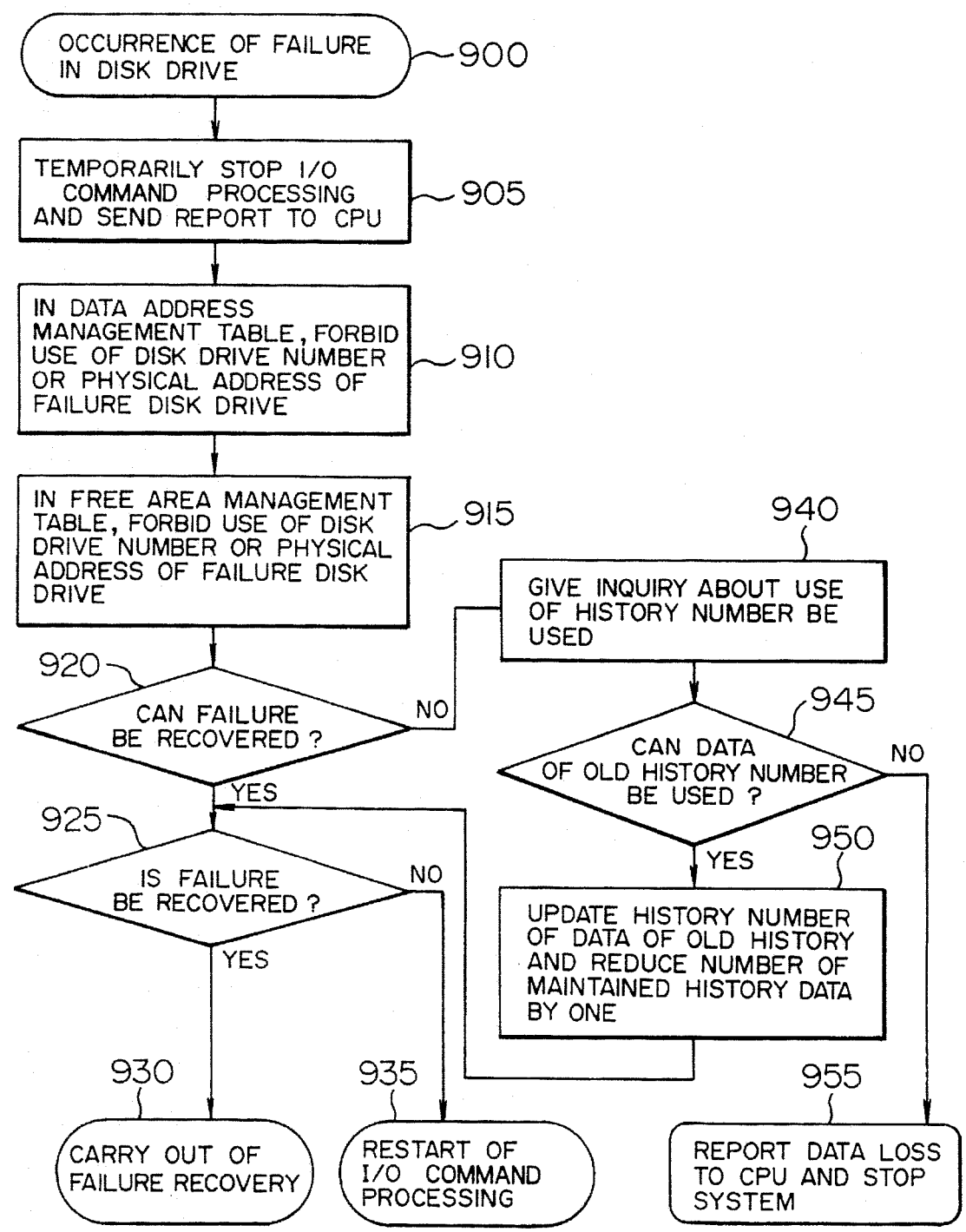
FIG. 11 is a flow chart showing a processing routine in the multiple-write/fault manager in a state in which a failure occurs.
Figure 12:
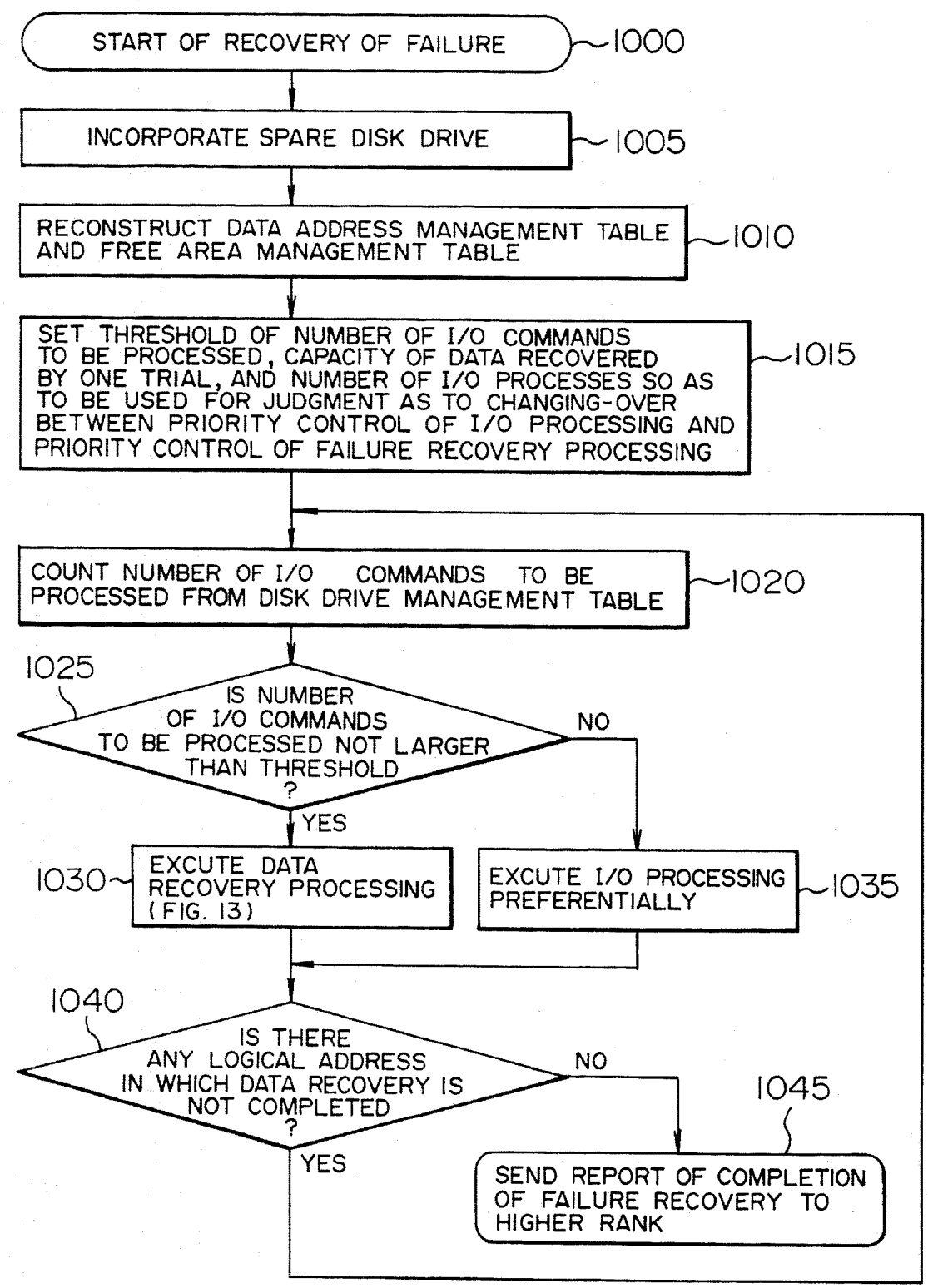
FIG. 12 is a flow chart showing the detail of the failure recovering routine.

FIG. 12 is a flow chart showing the detailed procedure of the failure recovery processing (a step 930 in FIG. 11).

When the judgment in the step 925 in FIG. 11 shows that the failure is to be recovered, the multiple-write/fault manager 80 starts failure recovery (a step 1000). Then, the data address management table 50 and the free area management table 55 are reconstructed (a step 1010). If it is necessary for supplementing capacity, idle reserve disk drives may be incorporated in this system as shown in a step 1005. In the case where the free area capacity EC is sufficiently larger than the capacity of data in the failure disk drive, however, the failure may be recovered according to the method of the present invention without provision of any reserve disk drive. Then, the threshold of the number of I/O commands to be processed, the capacity of data recovered by one trial, the period of priority of I/O processing or the number of I/O processes is set to be used for a judgment as to changing-over between priority control of I/O processing and priority control of failure recovery processing (a step 1015). In this embodiment, as will be described later, the failure recovery processing has priority over the I/O processing. In the case where the number of I/O commands to be processed is larger than a predetermined number, however, the I/O processing has priority to prevent abnormal increase of the number of I/O commands to be processed. In other words, in this embodiment, data recovery processing can be made while other I/O processing is carried out. The respective parameters set in the step 1050 are used for a judgment as to changing-over to processing to be carried out preferentially.

Then, the number of I/O commands to be processed is counted from the disk drive management table 60 (a step 1020). This counting is performed by calculating the sum of the respective numbers of I/O commands to be processed correspondingly to the disk drive numbers registered in the disk drive management table 60. In the next step, a check is made as to whether the number of I/O commands to be processed is not larger than the threshold (a step 1025).

When the number of I/O commands to be processed is larger than the threshold, I/O processing is carried out in a predetermined period or by the number of I/O processes, set in the step 1015 (a step 1035) whereafter the situation of the routine goes to a step 1040.

When the number of I/O commands to be processed is not larger than the threshold in the step 1025, data recovery processing is carried out (a step 1030) whereafter the step 1040 is carried out. In the step 1040, a check is made as to whether any logical address in which data recovery is not completed remains. When any logical address remains, the situation of the routine goes back to the step 1020 to continue failure recovery. When data recovery processing is completed for all logical addresses in which a failure occurs, the failure recovery is terminated so that the completion of the failure recovery is reported to the CPU 1 (a step 1045).

The threshold of the number of I/O commands, stored in an I/O buffer, may be used for the judgment as to changing over preferential control to I/O processing. In this case, the step 1020 is used for counting the number of I/O commands, stored in the I/O command buffer. Although the failure recovery herein is on the precondition that the failure recovery is carried out without stopping of I/O command processing, the present invention can be applied to the case where the failure recovery may be carried out after the I/O command processing is stopped.

Figure 13:
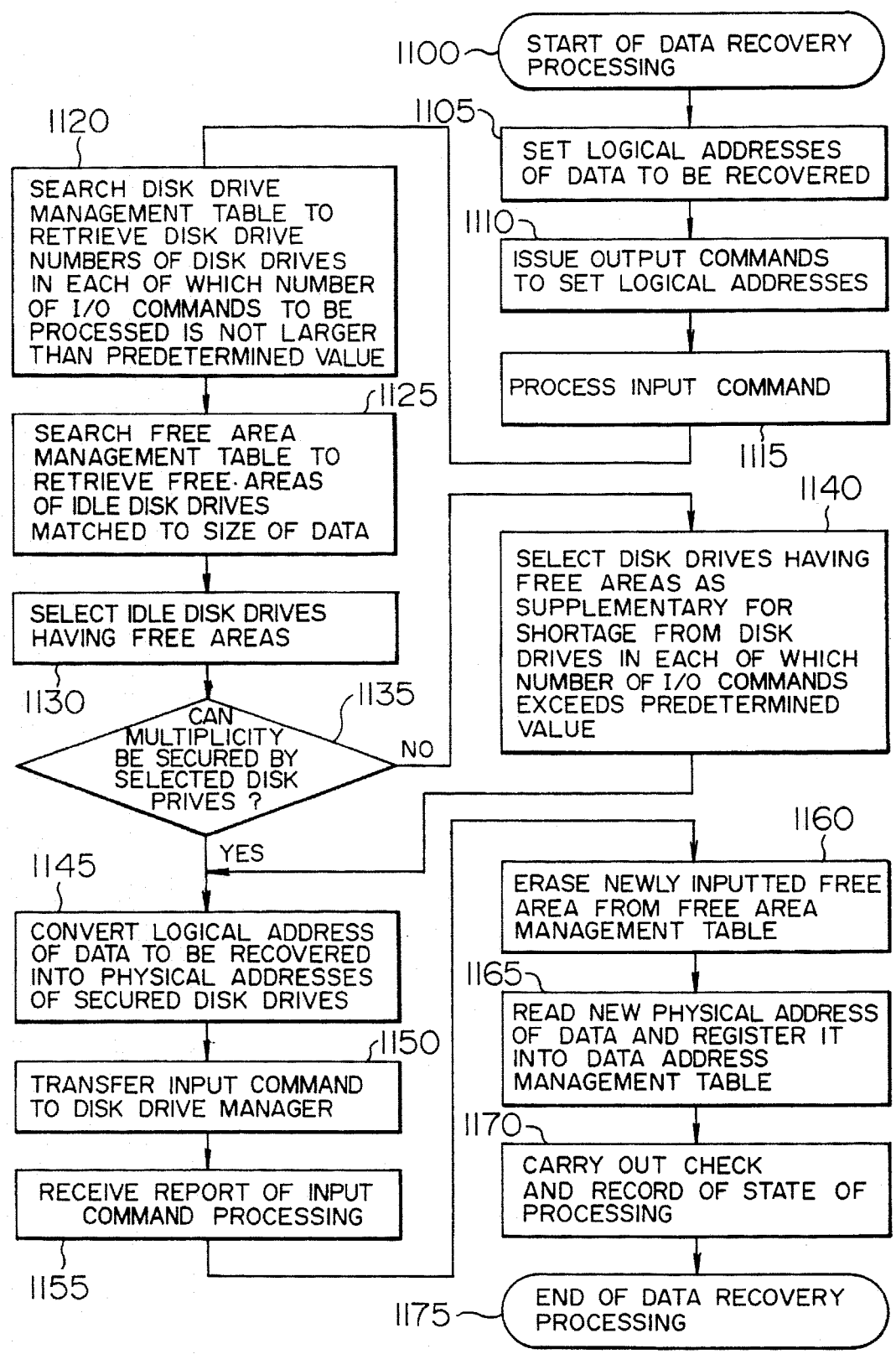
FIG. 13 is a flow chart showing the detail of the data recovering routine.

The detail of the data recovery processing (a step 1030) in FIG. 12 will be described below with reference to a flow chart of FIG. 13.

When data recovery processing is started (a step 1100), logical addresses of data to be recovered are set first (a step 1105). The logical addresses of data to be recovered are obtained by extracting logical addresses registered in the data address management table 50 on the basis of the disk drive number of the failure disk drive by referring to the data address management table 50. Then, output commands are issued from the command processing manager 75 to the logical addresses set in the step 1105, respectively (a step 1110). Then, data identical to the data stored in the failure disk drive are read from other disk drives by the output command processing described previously with reference to FIG. 7 (a step 1115). Then, free disk drive numbers in which the number of I/O commands to be processed is not larger than a predetermined number are retrieved by referring the disk drive management table 60 (a step 1120). Then, free areas of the respective disk drives, matched to the capacity of data read in the step 1115, are retrieved from the free area management table 55 (a step 1125). Although above description has been made upon the case where the steps 1120 and 1125 are carried out in this order, the present invention can be applied to the case where the steps may be carried out in parallel. Then, disk drives not only having data satisfying the condition as retrieved in the step 1120 but having free areas as retrieved in the step 1125 are selected (a step 1130). In the next step 1135, a check is made as to whether the selected disk drives can satisfy the multiplicity.

When the disk drives are short in number, disk drives having free areas are selected from the disk drives in which the number of I/O commands is larger than the predetermined number, in a step 1140 whereafter the situation of the routine goes to a step 1145. Then, the logical addresses of data to be recovered are converted into the physical addresses of the disk drives secured in the step 1130, by using the data address management table (a step 1145). Then, input commands are transferred to the disk drive manager 85 (a step 1150), so that the data read in the step 1115 are written in the disk drives secured in the steps 1130 and 1140. When a report of completion of input command processing is received from the disk drive manager 85 (a step 1155), free areas to which recovered data are inputted newly are deleted from the free area management table 55 (a step 1160) at the same time the new physical addresses of recovered data together with the correlation between the physical addresses and the logical addresses are registered in the data address management table 50 (a step 1165). Then, the state of processing is checked and recorded (a step 1170). Finally, the data recovery processing is terminated (a step 1175).

Although this embodiment has shown the case where recovery data are read through output commands issued from the multiple-write/fault manager 80 to the command processing manager 75 and are written directly by the multiple-write/fault manager 80, the present invention can be applied to the case where writing of recovery data may be carried out through I/O commands issued from the multiple-write/fault manager 80 to the command processing manager 75 so that the procedure of from the step 1120 to the step 1150 can be carried out by the command processing manager 75.

Although the aforementioned embodiments have shown the case where magnetic disk drives are used as the storage units, the present invention can be applied to the case where optical disk drives, floppy disk drives or semiconductor memories may be used as the storage units. Although the embodiments of the present invention have shown the case where the controller 2 of the secondary storage device 101, the disk drive controllers 90-1 to 90-n, the disk drives 16-1 to 16-n and so on are put in one box, the present invention can be applied to the case where the controller 2 of the secondary storage device 101, the disk drive controllers 90-1 to 90-n, the disk drives 16-1 to 16-n and so on may be disposed on a network so separately that the operation as shown in the description of the present invention can be adapted individually to these devices.

According to the embodiment of the present invention, when disk drives having original data cannot be used because of other I/O command processing, the data are stored in free areas of other disk drives allowed to be used. Accordingly, the phenomenon that the CPU is kept waiting for input commands though some disk drives can be used can be eliminated, so that an improvement in performance of I/O processing can be provided. Furthermore, data to be recovered at the time of recovery of a failure in any one of disk drives are obtained from identical data multiply copied in some disk drives so that the recovery data can be written at any time in write-enabled disk drives without writing of the data in specific disk drives. Accordingly, failure recovery processing in which lowering of performance of I/O processing can be minimized can be provided. Furthermore, in practical use, the addresses of data, the multiplicity of data and the history of data can be updated so as to be converted and processed in the inside of the aforementioned apparatus, by a simple user's operation of designating logical addresses of data. Accordingly, it is unnecessary for the user to make a wasteful operation.

The secondary storage device according to the present invention has an advantage in that new disk drives can be extended easily.

That is, it is now assumed that the (n+1)-th disk drive as a new disk drive is added to the secondary storage device 101 as shown in FIG. 1 or 2. In this case, the disk drive number #(n+1) with respect to which all areas in the free area management table 55 are free is added as shown in the broken line in FIG. 4. On the other hand, the disk drive number #(n+1) with respect to which the number of I/O commands to be processed is zero, that is, "000" as a binary number, is added as shown in the broken line in FIG. 5.

When the controller 2 executes input commands from the CPU 1 as shown in FIG. 8 in this condition, the possibility that the extended disk drive #(n+1) is selected as one of disk drives to be subjected to multiple writing is higher compared with the other disk drives because the disk drive #(n+1) is sufficient in free area capacity and smallest in the number of I/O commands to be processed. Accordingly, the data store capacity of the extended disk drive #(n+1) increases so rapidly that it approaches to the data store capacity of each of the other disk drives.

As described above, the secondary storage device according to the present invention is highly flexible both in extension of storage units and in removal of storage units having trouble with a failure.

We claim:

1. A method for writing multiple copies of identical data in storage units among a plurality of storage units in a data processing system executed by a controller for controlling said plurality of storage units, comprising:

detecting presence of data read/write commands already issued from a higher rank apparatus and awaiting in a buffer for execution by said controller for each of said plurality of storage units, in response to one data write command issued from said higher rank apparatus;

selecting a predetermined number of storage units to execute said one data write command, among said plurality of storage units on a basis of a detection result of said detecting step, said predetermined number of storage units being smaller in number than said plurality of storage units; and writing data required to write by said one data write command into each of the predetermined number of storage units selected;

wherein said selecting step selects said predetermined number of storage units on a basis of a number of the data read/write commands awaiting execution in each of said plurality of storage units.

2. A method for reading, among a plurality of storage units in a data processing system, data whose multiple copies are stored in a predetermined number of storage units which are smaller in number than said plurality of storage units and executed by a controller for controlling said plurality of storage units, comprising:

detecting presence of data read/write commands already issued from a higher rank apparatus and awaiting in a buffer for execution by said controller for each of a first predetermined number of storage units, in response to one data read command issued from said higher rank apparatus;

selecting a second predetermined number of storage units to execute said one data read command, among said first predetermined number of storage units on a basis of a detection result of said detecting step, said second predetermined number of storage units being smaller in number than said first predetermined number of storage units; and reading data required to read by said one data read command, from a storage unit which can firstly execute said one data read command, among said second predetermined number of storage units;

wherein said selecting step selects said second predetermined number of storage units on a basis of a number of the data read/write commands awaiting execution in each of said first predetermined number of storage units.

3. A method for writing multiple copies of identical data in storage units among a plurality of storage units and executed by a controller for controlling said plurality of storage units, comprising:

registering store address for each of data stored in each of said plurality of storage units in a data address management table;

registering an address of a free storage area and a free capacity for each of said plurality of storage units in a free area management table;

registering a number of data read/write commands already issued from a higher rank apparatus and awaiting in a buffer for execution by said controller for each of said plurality of storage units in a storage unit management table;

selecting, in response to one data write command issued from said higher rank apparatus, a predetermined number of storage units having a discrete free capacity for storing data required to write by said one data write command and lesser numbers of the data read/write commands awaiting execution, among said plurality of storage units, by accessing said free area management table and said storage unit management table, said predetermined number of storage units being smaller in number than said plurality of storage units;

writing said data required to write by said one data write command in a free area of each of said predetermined number of storage units by accessing said data address management table; and updating said data address management table, said free area management table and said storage unit management table after the writing of said data.

4. A method according to claim 3, wherein if storage units having a discrete free capacity for storing said data required to write are smaller in number than said predetermined number of storage units, said selecting step comprises the steps of:

changing an area in a storage unit of data oldest in history related to said data required to write to a free area, by accessing said address management table; and selecting said storage unit having a newly produced free area as one of said predetermined number of storage units.

5. A method according to claim 3, further comprising the steps of:

in response to adding at least one new storage unit to said plurality of storage units, updating said free area management table and said storage unit management table correspondingly to the addition of said new storage unit.

6. A method for reading, among a plurality of storage units in a data processing system, data whose multiple copies are stored in a first predetermined number of storage units which are smaller in number than said plurality of storage units and executed by a controller for controlling said plurality of storage units, comprising:

registering a store address, a history and a number of multiple writings for each of data stored in said plurality of storage nits in a data address management table;

registering a number of data read/write commands already issued from a higher rank apparatus and awaiting in a buffer execution by said controller for each of said plurality of storage units;

selecting, among said first predetermined number of storage units, a second predetermined number of storage units to execute one data read command issued from said higher rank apparatus by accessing said storage unit management table, in response to said one data read command, said second predetermined number of storage units being smaller in number than said first predetermined number of storage units;

transferring said one data read command to the second predetermined number of storage units selected;

canceling said one data read command to the second predetermined number of storage units other than a storage unit first reporting achieving a connection, in response to a first report of achieving a connection from the second predetermined number of storage units; and reading data required to read by said one data read command from the storage unit first reporting achieving a connection, to transfer said data required to read to said higher rank apparatus.

7. A method for recovering, among a plurality of storage units in a data processing system, data whose multiple copies are stored in a predetermined number of storage units which are smaller in number than said plurality of storage units and executed by a controller for controlling said plurality of storage units, comprising:

registering a store address for each of data in each of said plurality of storage units in a data address management table;

registering an address of a free storage area and a free capacity for each of said plurality of storage units in a free area management table;

registering a number of data read/write commands already issued from a higher rank apparatus and awaiting in a buffer execution by said controller for each of said plurality of storage units in a storage unit management table;

updating said storage unit management table to prevent a failed storage unit from being used by said higher rank apparatus when occurrences of a failure is detected in any one of said plurality of storage units;

determining data stored in normal storage units to be used for a recovery operation of data in the failed storage unit, by accessing said data address management table;

selecting a storage unit having a free capacity for storing said data to be recovered and a predetermined time to start the recovery operation of data among said plurality of storage units other than the failed storage unit, by accessing said free area management table and said storage unit management table; and writing said data to be used for the recovery operation of data in the storage unit selected, by accessing said data address management table.

8. A method for recovering data according to claim 7, wherein said data determining step includes the steps of:

determining use of history data in carrying out the recovery operation of data; and decreasing a history stage number of said history data in said data address management table by one, said history stage number indicating a degree of oldness of said history data in a descending order.

9. A method according to claim 1, wherein each of said storage units is a disk drive.

10. A method according to claim 2, wherein each of said storage units is a disk drive.

11. A method according to claim 1,
wherein said method further comprises a step of detecting a free storage capacity for each of said plurality of storage units in response to said data write command just issued by said higher rank apparatus, and
wherein said selecting step includes a step of selecting said second predetermined number of storage units each having a free capacity for storing said data required to write on a basis of a result of said free storage capacity detecting step.

12. A controller for writing multiple copies of identical data in storage units among a plurality of storage units in a data processing system, comprising:
means for receiving a data write command issued from a higher rank apparatus;
means for detecting presence of data read/write commands already issued from said higher rank apparatus and awaiting in a buffer execution by said controller for each of a plurality of storage units, in response to inputting of said data write command just received by said receiving means;
means for selecting a predetermined number of storage units to execute one said data write command among said plurality of storage units on a basis of a result of said detection, said predetermined number of storage units being smaller in number than said plurality of storage units; and
means for writing data required to write by said data write command just received into each of said predetermined number of storage units;
wherein said selecting means selects said predetermined number of storage units on a basis of a number of the data read/write commands awaiting execution in each of said plurality of storage units.

13. A controller for reading, among a plurality of storage units in a data processing system, data whose multiple copies are stored in a first predetermined number of storage units which are smaller in number than said plurality of storage units, comprising:
means for receiving a data read command issued from a higher rank apparatus;
means for detecting presence of data read/write commands already issued from said higher rank apparatus and awaiting in a buffer their execution by said controller for each of said first predetermined number of storage units in response to said data read command just received;
means for selecting a second predetermined number of storage units which can start more quickly to execute said data read command just received, among said first predetermined number of storage units on a basis of a result of said detection, said second predetermined number of storage units being smaller in number than said first predetermined number of storage units; and
means for reading data required to read by said data read command just received, from a storage unit which can firstly execute said data read command just received, among said second predetermined number of storage units;
wherein said selecting means selects said second predetermined number of storage units on a basis of a number of the data read/write commands awaiting execution in each of said first predetermined number of storage units.

14. A controller for writing multiple copies of identical data in storage units among a plurality of storage units in a data processing system, comprising:
a data address management table for registering therein a store address for each of data in each of a plurality of storage units;
a free area management table for registering therein an address of a free storage area and a free capacity for each of said plurality of storage units;
a storage unit management table for registering therein a number of data read/write commands already issued from said higher rank apparatus and awaiting in a buffer execution by said controller for each of said plurality of storage units;
means for receiving a data write command issued from said higher rank apparatus;
means for selecting a predetermined number of storage units having a discrete free capacity for storing data required to write by one data write command received by said data write command receiving means and lesser numbers of the data read/write commands awaiting execution among said plurality of storage units, by accessing said free area management table and said storage unit management table in response to said one data write command just received;
means for writing said data required to write by said one data write command in a free area of each of said predetermined number of storage units, by accessing said data address management table; and
means for updating said data address management table, said free area management table and said storage unit management table after the writing of said data.

15. A controller according to claim 14, wherein if storage units having a discrete free capacity for storing said data required to write are smaller in number than said predetermined number of storage units, said selecting means executes the steps of:
changing an area in a storage unit of data oldest in history related to said data required to write to a free area by accessing said address management table; and
selecting said storage unit having the newly produced free area as one of said predetermined number of storage units.

16. A controller for reading, among a plurality of storage units in a data processing system, data whose multiple copies are stored in a first predetermined number of storage units which are smaller in number than said plurality of storage units, comprising:
a data address management table for registering therein a store address, a history and a number of multiple writings for each of data in each of said plurality of storage units;
a storage unit management table for registering therein a number of data read/write commands already issued from a higher rank apparatus and awaiting in a buffer execution by said controller for each of said plurality of storage units;
means for receiving data read commands issued from said higher rank apparatus;
means for selecting, among said first predetermined number of storage units, a second predetermined number of storage units to execute one said data read command by accessing said storage unit management table;

means for transferring said one data read command to the second predetermined number of storage units selected;

means for canceling said one data read command to the second predetermined number of storage units other than a storage unit first reporting achieving a connection, in response to the first report of achieving a connection from the second predetermined number of storage units; and means for reading data required to read by said data read command just received, from the storage unit first reporting achieving a connection, to transfer said data required to read to said higher rank apparatus.

17. A controller for recovering, among a plurality of storage units in a data processing system, data whose multiple copies are stored in a predetermined number of storage units which are smaller in number than said plurality of storage units, comprising:

a data address management table for registering therein a store address for each of data in each of said plurality of storage units;

a free area management table for registering therein an address of a free storage area and a free capacity for each of said plurality of storage units;

a storage unit management table for registering therein a number of data read/write commands already issued from a higher rank apparatus and awaiting in a buffer execution by said controller for each of said plurality of storage units;

means for detecting occurrence of a failure in any one of said storage units;

means responsive to occurrence of a failure by said detecting means, for updating said storage unit management table to prevent the failed storage unit from being used by said higher rank apparatus;

means for determining data stored in normal storage units to be used for a recovery operation of data in the failed storage unit, by accessing said data address management table;

means for selecting a storage unit having a free capacity for storing data to be recovered and a predetermined time to start the recovery operation of data among said plurality of storage units other than the failed storage unit, by accessing said free area management table and said storage unit management table; and means for writing said data to be used for the recovery operation of data in said storage unit selected, by accessing said data address management table.

18. A controller according to claim 17, wherein said determining means includes:

means for determining use of history data in carrying out the recovery operation of data; and means for decreasing a history stage number of said history data in said data address management table by one, said history stage number indicating a degree of oldness of said history data in a descending order.

19. A controller according to claim 12, wherein each of said storage units is a disk drive.

20. A controller according to claim 13, wherein each of said storage units is a disk drive.

21. A controller according to claim 12, wherein said controller further comprises means for detecting a free storage capacity for each of said plurality of storage units in response to said write command just received, and wherein said selecting means includes means for selecting said second predetermined number of storage units each having a free capacity for storing said data required to write on a basis of a result of said free storage capacity detecting means.

* * * * *